(12) United States Patent
Matsushita

(10) Patent No.: US 6,593,813 B2
(45) Date of Patent: Jul. 15, 2003

(54) NEGATIVE FEED-BACK AMPLIFIER AND METHOD FOR NEGATIVE FEED-BACK

(75) Inventor: Tsuyoshi Matsushita, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 09/872,730

(22) Filed: Jun. 1, 2001

(65) Prior Publication Data

US 2001/0050594 A1 Dec. 13, 2001

(30) Foreign Application Priority Data

Jun. 2, 2000 (JP) .................................. 2000-166868

(51) Int. Cl.[7] .............................................. H03F 3/26
(52) U.S. Cl. ...................................... 330/265; 330/271
(58) Field of Search ................................ 330/265, 271, 330/291, 293, 267, 273, 263

(56) References Cited

U.S. PATENT DOCUMENTS

| | | | | |
|---|---|---|---|---|
| 3,424,992 A | * | 6/1965 | Zielinski et al. | ............. 330/265 |
| 3,437,944 A | * | 1/1968 | Camenzind | .................. 330/265 |
| 3,750,039 A | * | 7/1973 | Williams, Jr. | ................ 330/271 |
| 5,352,992 A | * | 10/1994 | Asazawa | ..................... 330/291 |

FOREIGN PATENT DOCUMENTS

| | | | | |
|---|---|---|---|---|
| JP | 05-327362 | 12/1993 | ............. | H03F/1/34 |
| JP | 06-326523 | 11/1994 | ............. | H03F/1/34 |

* cited by examiner

*Primary Examiner*—Tuan T. Lam
(74) *Attorney, Agent, or Firm*—Hayes Soloway P.C.

(57) ABSTRACT

A negative feed-back amplifier is provided in which a distortion of signals is reduced and a dynamic range is increased. An input signal is input to a base of a transistor and is output from a collector as a reversed signal and a non-reversed signal is output from an emitter. The reversed signal is input to a base of a transistor and is output through a resistor from an emitter of the transistor. The non-reversed signal is input through a condenser to a base of a transistor and is output from a collector in a reversed form. An output signal from the transistor is input to an emitter follower of a transistor at high input impedance and output at low output impedance and then attenuated by resistors and negative feed-back signal is produced. The negative feed-back signal is input through a resistor to a base of the transistor to be added to the input signal.

10 Claims, 6 Drawing Sheets

(a) base voltage V12

(b) reversed signal V13a (c) non-reversed signal V14c (d) output signal OUT (a) base voltage V12

(b) reversed signal V13a (c) non-reversed signal V14c (d) output signal OUT (picture signal related circuit)

NEGATIVE FEED-BACK AMPLIFIER AND METHOD FOR NEGATIVE FEED-BACK

BACKGROUND OF THE INVENTION

1. Field of the Invention

The present invention relates to a negative feed-back amplifier and more particularly to a negative feed-back amplifier that can be suitably used in a video IF (Intermediate Frequency) amplifier installed on a video signal circuit of a television and to a method for negative feed-back.

The present application claims priority of Japanese Patent Application No. 2000-166868 filed on Jun. 2, 2000, which is hereby incorporated by reference.

2. Description of the Related Art

As shown in FIG. 8, a picture signal related circuit of a television is provided with a tuner 1, a band-pass filter (hereinafter referred to as a BPF 2), a local oscillator 3, a mixer 4, an immediate frequency preamplifier (hereinafter referred to as an IF frequency preamplifier 5), a condenser 6, and an intermediate frequency main amplifier (hereinafter referred simply to as an IF main amplifier 7). The IF preamplifier 5, the condenser 6, and a negative feed-back amplifier (the IF main amplifier 7) make up a video IF amplifier.

FIG. 9 is a circuit diagram showing electrical configurations of the IF main amplifier 7 shown in FIG. 8. The IF main amplifier 7 is provided with a bipolar transistor (hereinafter referred to a transistor 7a), a resistor 7b, a resistor 7c, a transistor 7d, a transistor 7e, a resistor 7f, a resistor 7g, and a resistor 7h.

In the picture signal related circuit, a receiving signal received by an antenna (not shown) is input to the tuner 1 and a video intermediate frequency signal V1 is output from the tuner 1. The video intermediate frequency signal V1 is then input to the BPF 2 and an output signal V2 in a predetermined frequency band is output. The output signal V2 is mixed with an output signal V3 fed from the local oscillator 3 by the mixer 4 and an output signal V4 is output from the mixer 4. The output signal V4 is amplified by the IF preamplifier 5 and an output signal V5 is output from the IF preamplifier 5. The output signal V5 is input to the IF main amplifier 7 through the condenser 6 and amplified and then a video detecting signal "OUT" is output from the IF main amplifier 7. The video detecting signal "OUT" is transmitted to a video detecting amplifier (not shown). In this case, as shown in FIG. 9, an output impedance of the IF main amplifier 7 is determined by the resistor 7f and a resistance of the resistor 7f is set to a value that does not cause the video detecting signal "OUT" to occur, with considerations given to a state of matching with a characteristic impedance of a transmission line connected to an output of the IF main amplifier 7 and with an input impedance of the video detecting amplifier (not shown). Moreover, the video detecting signal "OUT" is fed back to a base of the transistor 7a through the resistor 7h.

However, in the conventional IF main amplifier 7, since, depending on set values of the resistors 7b, 7c, 7f, and 7g, a base potential of the transistor 7a becomes too high and a dynamic range in a first stage becomes small; if an input signal "IN" is large, in some cases, a distortion of the video detecting signal "OUT" increases. This presents a problem in that an image quality of the television deteriorates.

SUMMARY OF THE INVENTION

In view of the above, it is an object of the present invention to provide a negative feed-back amplifier and a method for negative feed-back which are capable of preventing a distortion of a signal even if an input signal is large.

According to a first aspect of the present invention, there is provided a negative feed-back amplifier including;

a push-pull amplifier made up of bipolar transistors and used to amplify an input signal and to output an output signal; and a negative feed-back circuit used to bias a base of a bipolar transistor at an initial stage of the push-pull amplifier by using a negative feed-back signal produced by attenuation of the output signal at a predetermined feedback ratio.

According to a second aspect of the present invention, there is provided a negative feed-back amplifier including:

a push-pull amplifier made up of bipolar transistors and used to amplify an input signal and to output an output signal; and a negative feed-back circuit used to bias a base of a bipolar transistor at an initial stage of the push-pull amplifier by using a negative feed-back signal produced by attenuation of a signal corresponding to the output signal at a predetermined feedback ratio.

According to a third aspect of the present invention, there is provided a negative feed-back amplifier including:

a phase inverter amplifier used to amplify an input signal and to produce a reversed signal of a phase opposite to the input signal and to produce a non-reversed signal being in phase with the input signal;

a push-pull output circuit used to produce an output signal of a phase opposite to the input signal by inputting the reversed signal at high input impedance and outputting the reversed signal at low output impedance and outputting the non-reversed signal in a reversed state;

a negative feed-back circuit used to produce a negative feed-back signal by inputting the output signal and to add the negative feed-back signal to the input signal; and wherein the negative feed-back circuit is provided with a feedback ratio setting circuit used to attenuate the output signal at a predetermined feedback ratio and to produce the negative feed-back signal.

According to a fourth aspect of the present invention, there is provided a negative feed-back amplifier including:

a phase inverter amplifier used to amplify an input signal and to produce a reversed signal of a phase opposite to the input signal and to produce a non-reversed signal being in phase with the input signal;

a push-pull output circuit used to produce an output signal of a phase opposite to the input signal by inputting the reversed signal at high input impedance and outputting the reversed signal at low output impedance and outputting the non-reversed signal in a reversed state;

a negative feed-back circuit used to produce a negative feed-back signal by inputting the output signal and to add the negative feed-back signal to the input signal; and wherein the negative feed-back circuit has an impedance converter used to produce a feed-back signal by inputting the output signal at high input impedance and outputting the output signal at low output impedance and a feed-back ratio setting circuit used to produce the negative feed-back signal by attenuating the feed-back signal at a predetermined feed-back ratio.

According to a fifth aspect of the present invention, there is provided a negative feed-back amplifier including:

a phase inverter amplifier used to amplify an input signal and to produce a reversed signal of a phase opposite to the input signal;

a push-pull output circuit used to produce an output signal of a phase opposite to the input signal by inputting the reversed signal at high input impedance and outputting the reversed signal at low output impedance;

a negative feed-back circuit used to produce a negative feed-back signal by inputting the output signal and to add the negative feed-back signal to the input signal; and wherein the negative feed-back circuit is provided with a feedback ratio setting circuit used to attenuate the output signal at a predetermined feedback ratio and to produce the negative feed-back signal.

According to a sixth aspect of the present invention, there is provided a negative feed-back amplifier including:

a phase inverter amplifier used to amplify an input signal and to produce a reversed signal of a phase opposite to the input signal;

a push-pull output circuit used to produce an output signal of a phase opposite to the input signal by inputting the reversed signal at high input impedance and outputting the reversed signal at low output impedance;

a negative feed-back circuit used to produce a negative feed-back signal by inputting the output signal and to add the negative feed-back signal to the input signal; and wherein the negative feed-back circuit has an impedance converter used to produce a feed-back signal by inputting the output signal at high input impedance and outputting the output signal at low output impedance and a feed-back ratio setting circuit used to produce the negative feed-back signal by attenuating the feed-back signal at a predetermined feed-back ratio.

In the foregoing, a preferable mode is one wherein the impedance converter is made up of an emitter follower of a bipolar transistor or a source follower of an FET (Field Effect Transistor).

According to a seventh aspect of the present invention, there is provided a negative feed-back method including:

a step of biasing a base of a bipolar transistor at an initial stage of a push-pull amplifier by using a negative feed-back signal which is produced by attenuation of an output signal at a predetermined feedback ratio in the push-pull amplifier made up of bipolar transistors and used to amplify an input signal and to output the output signal.

According to an eighth aspect of the present invention, there is provided a negative feed-back method including:

a step of biasing a base of a bipolar transistor at an initial stage of a push-pull amplifier by using a negative feed-back signal which is produced by attenuation of a signal corresponding to an output signal at a predetermined feedback ratio in the push-pull amplifier made up of bipolar transistors and used to amplify an input signal and to output the output signal.

With the above configuration, the output signal from the push-pull amplifier is attenuated by a feedback ratio setting circuit and is fed back to a base of a phase inverter amplifier, thus allowing proper setting of a base bias voltage of the bipolar transistor. This enables a dynamic range of the phase inverter amplifier to be made larger and distortion of the output signal to be reduced and, therefore, when this negative feed-back amplifier is used as a video IF amplifier in televisions, it serves to improve an image quality of the televisions.

With another configuration, the output signal is input to an impedance converter and, as a result, a load is taken off an output circuit and distortion of output signals can be reduced.

With still another configuration, the negative feed-back circuit is mounted independently of the output circuit and, therefore, even if feedback ratio is increased, the bipolar transistor of the output circuit is not easily saturated, thus serving to increase load driving capability and to make calibration of output impedance easier.

With still another configuration, the output circuit is made up of a push-pull type circuit in which a reversed signal is input at high input impedance and output at low output impedance, thus making it possible to make up a comparatively simpler negative feed-back amplifier.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
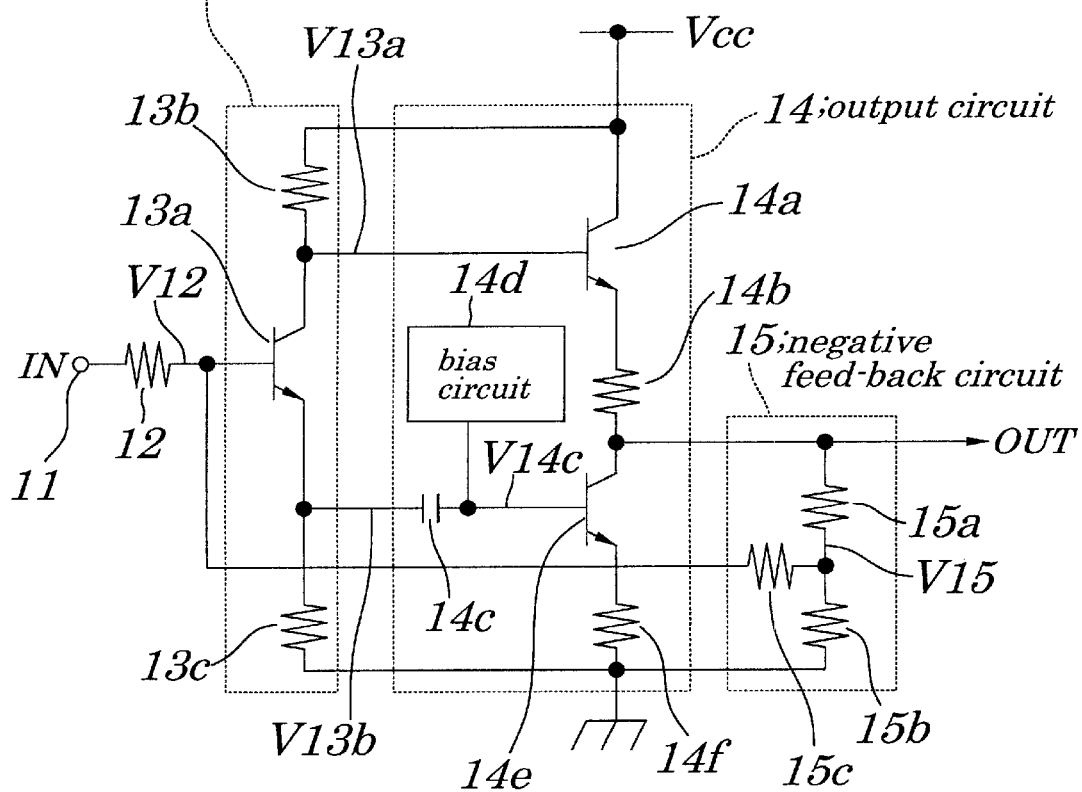
FIG. 1 is a schematic circuit diagram showing electrical configurations of a negative feed-back amplifier according to a first embodiment of the present invention.

FIG. 1 is a schematic circuit diagram showing electrical configuration of a negative feed-back amplifier according to a first embodiment of the present invention. The negative feed-back amplifier of the first embodiment includes, as shown in FIG. 1, an input terminal 11, a resistor 12, a phase inverter amplifier 13, an input circuit 14, and a negative feed-back circuit 15. The phase inverter amplifier 13 has an npn-type transistor 13a, a resistor 13b, and a resistor 13c, which is used to amplify an input signal "IN" and to produce a reversed signal V13a of a phase opposite to the input signal "IN" and a non-reversed signal V13b being in phase with the input signal "IN". The output circuit 14 has an npn-type 14a, a resistor 14b, a condenser 14c, a bias circuit 14d, an npn-type transistor 14e and a resistor 14f, which is used to input the reversed signal V13a at high input impedance and to output it at low output impedance and, by reversing the non-reversed signal V13b and by outputting it, to produce an output signal "OUT" of a phase opposite to the input signal "IN". The negative feed-back circuit 15 has resistors 15a and 15b operated to attenuate the output signal "OUT" at a feedback ratio and to produce a negative feed-back signal V15, which is used to add the negative feed-back signal V15 to the input signal "IN" through the resistor 15c. The resistors 15a and 15b make up a feedback ratio setting circuit.

Figure 2:
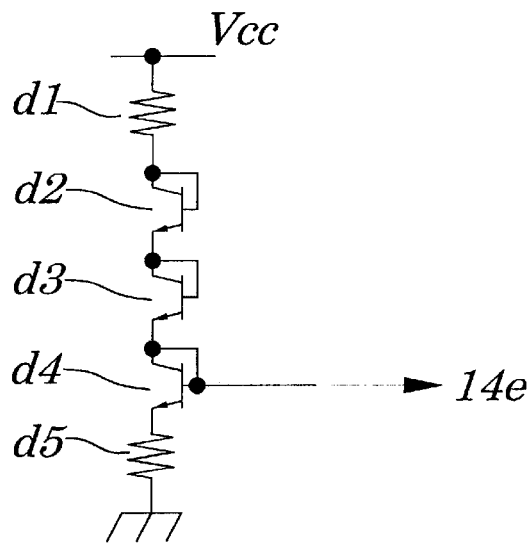
FIG. 2 is a circuit diagram showing one example of a bias circuit shown in FIG. 1 according to the first embodiment of the present invention.

FIG. 2 is a circuit diagram showing one example of the bias circuit 14d shown in FIG. 1. The bias circuit 14d includes a resistor d1, transistors d2, d3, and d4 connected to diodes and a resistor d5 and an operating point of the transistor 14e is set in a start-up range.

FIGS. 3A, 3B, 3C and 3d are wave-form diagrams of each of signals explaining operation of the negative feed-back amplifier according to the first embodiment of the present invention, in which a voltage is plotted as ordinate and time as abscissa. The operation of the negative feed-back amplifier is explained by referring to these figures.

Figure 3A:
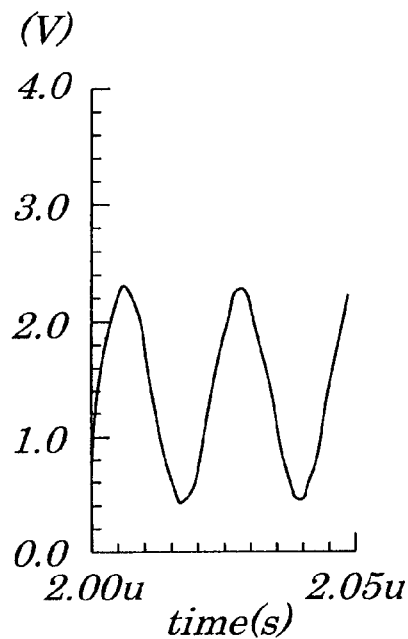
FIGS. 3A, 3B, 3C, and 3D are wave-form diagrams of each of signals explaining operation of the negative feed-back amplifier according to the first embodiment of the present invention.
Figure 3B:
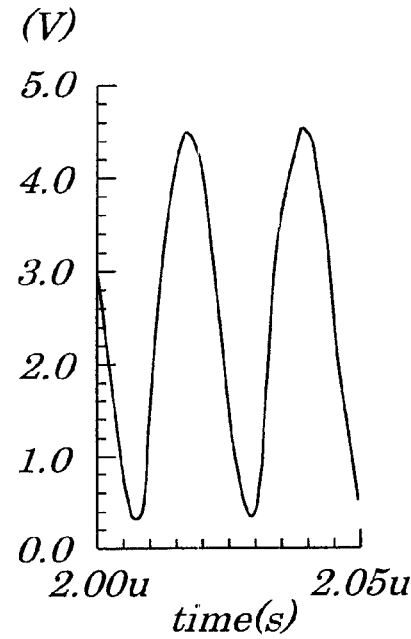
Figure 3C:
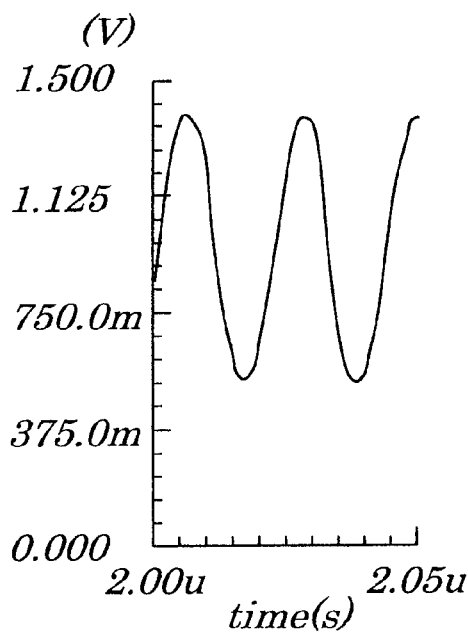
Figure 3D:
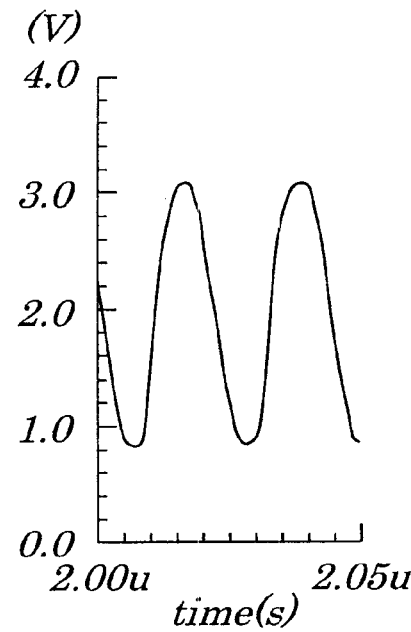

The input signal "IN" is input through the input terminal 11 and the resistor 12 to a base of the transistor 13a and a base voltage V12 (FIG. 1) as shown in FIG. 3A is generated. The reversed signal V13a as shown in FIG. 3B is output from a collector of the transistor 13a and the non-reversed signal V13b is output from an emitter of the transistor 13a. The reversed signal V13a is input, at high input impedance, to a base of the transistor 14a and is output, at low output impedance, from an emitter of the transistor 14a through the resistor 14b. The non-reversed signal V13b is input, as a non-reversed signal V14c as shown in FIG. 3C, to a base of the npn-type transistor 14e through the condenser 14c and is output, in an inverted state, from a collector of the npn-type transistor 14e. Therefore, an output signal "OUT" of a phase opposite to the input signal "IN" as shown in FIG. 3D is output. At this point, the output impedance of the negative feed-back amplifier is determined by combining a serial resistance of the resistors 15a and 15b with the resistance of the resistor 14b, and parallel resistance is so set as to prevent an occurrence of reflection of the output signal "OUT" with consideration given to matching with a characteristic impedance or a load impedance of a transmission line connected to an output side of the negative feed-back circuit 15.

Moreover, the output signal "OUT" is attenuated by the resistors 15a and 15b and, as a result, the negative feed-back signal V15 is generated. The negative feed-back signal V15 is input to a base of the transistor 13a through the resistor 15c and is added to the input signal "IN". At this point, a base bias voltage is set properly and a dynamic range is made larger, thus minimizing distortion of signals.

Thus, according to the first embodiment, since the output signal "OUT" is attenuated by the resistors 15a and 15b and is fed back to the base of the transistor 13a, the base bias voltage of the transistor 13a is properly set. This causes a dynamic range of the phase inverter amplifier 13 to be made larger and distortion of signals to be reduced and, as a result, if this negative feed-back amplifier is used in a video IF amplifier, image quality of televisions is improved.

Second Embodiment

Figure 4:
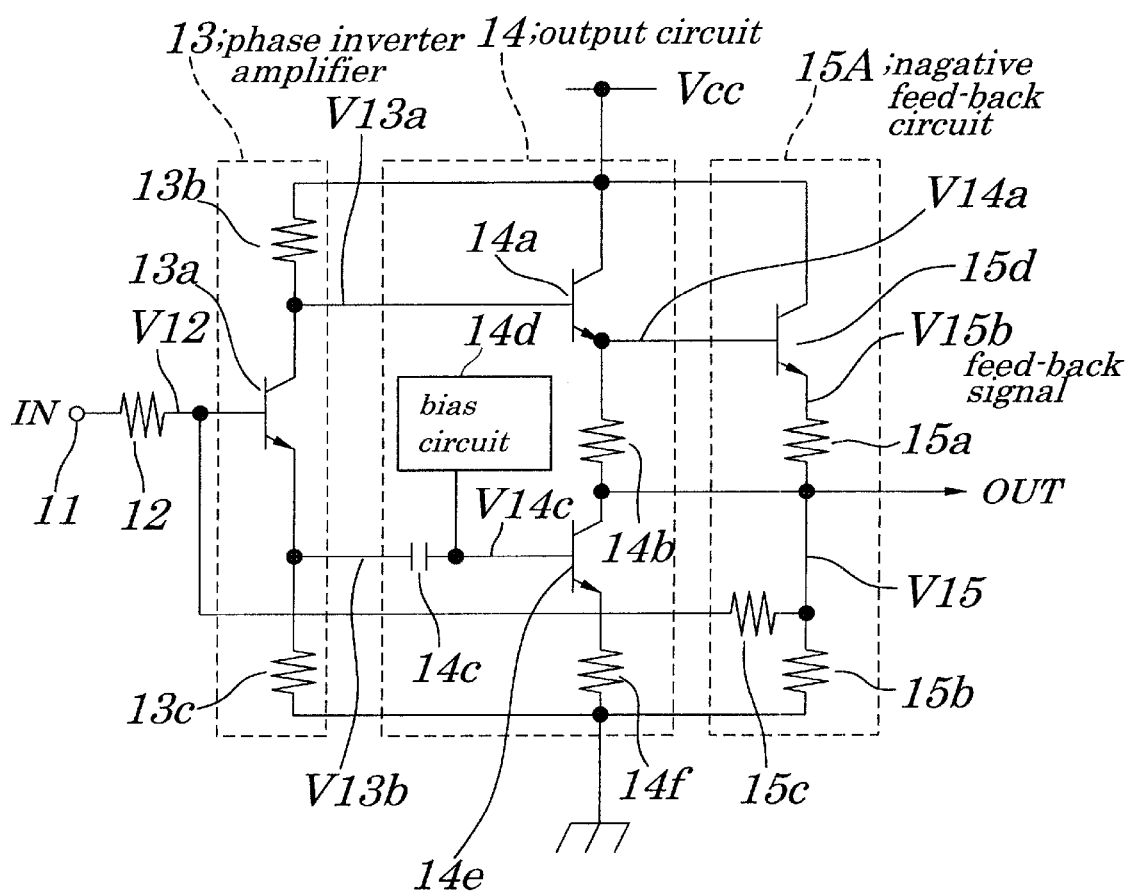
FIG. 4 is a schematic circuit diagram showing electric configurations of a negative feed-back amplifier according to a second embodiment of the present invention.
Figure 5A:
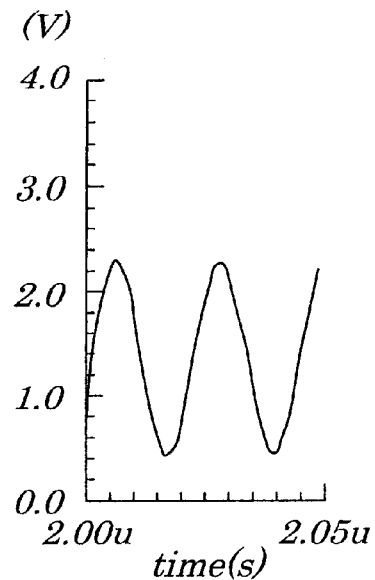
FIGS. 5A, 5B, 5C, and 5D are wave-form diagrams of each of signals explaining operation of the negative feed-back amplifier according to the second embodiment of the present invention.
Figure 5B:
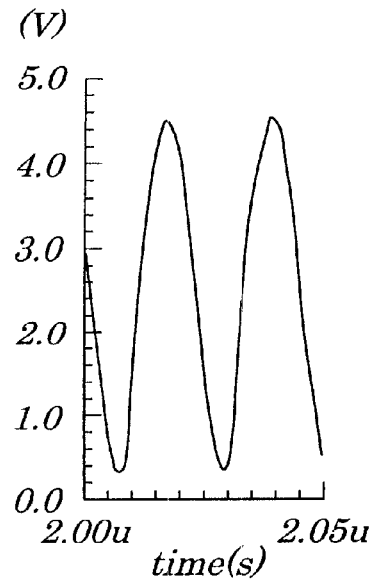
Figure 5C:
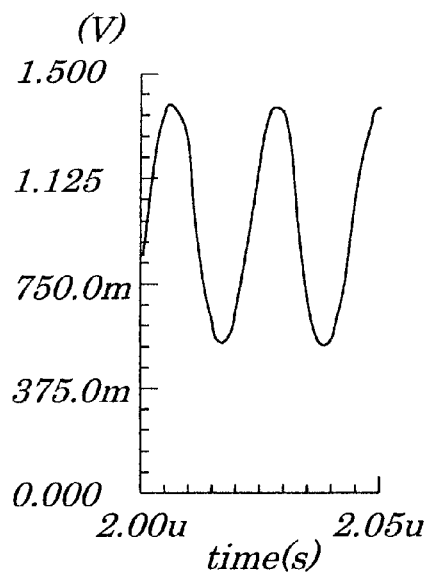
Figure 5D:
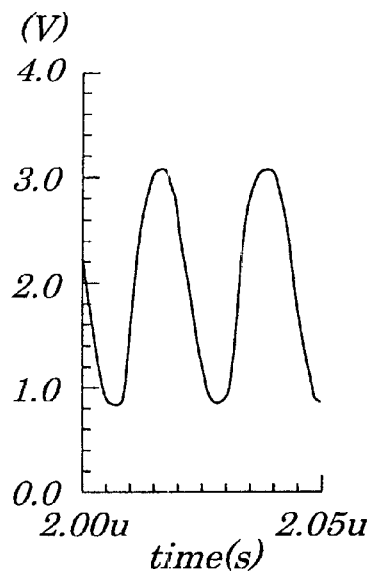

FIG. 4 is a schematic circuit diagram showing electric configurations of a negative feed-back amplifier according to a second embodiment of the present invention. In FIG. 4, the same reference numbers as those in the first embodiment are assigned to components having the same functions as in FIG. 1. The negative feed-back amplifier of the second embodiment is provided with a negative feed-back circuit 15A having configurations being different from a negative feed-back circuit 15 shown in FIG. 1. The negative feed-back circuit 15A has a transistor 15d. A base of the transistor 15d is connected to an emitter of a transistor 14a and a collector of the transistor 15d is connected to a terminal for a supply voltage VCC and an emitter of the transistor 15d is connected to a resistor 15a. The transistor 15d is an impedance transforming unit (that is, an emitter follower) adapted to produce a feed-back signal V15d by inputting an output signal V14a output from the transistor 14a at high input impedance and outputting at low output impedance. Other configurations are the same as those in FIG. 1.

As shown in FIGS. 5A, 5B, 5C, and 5D, a waveform of each of signals is the same as shown in the first embodiment. However, operation of the negative feed-back amplifier of the second embodiment is different in following points. That is, since the output signal V14a output from the transistor 14a is input at high input impedance to a base of the transistor 15d, loads on the transistor 14a are removed and distortions of the output signal V14a are reduced. Even if a feed-back ratio is increased by decreasing a resistance of the resistor 15a, since there is no influence on a voltage of a collector of a transistor 14e, that is, voltage does not fall, the transistor 14e is not easily saturated, thus serving to increase load driving capacity. Since the negative feed-back circuit 15A is configured so as to be operated independently from the output circuit 14, output impedance of the negative feed-back amplifier is determined by a resistance of a resistor 14b and there is no influence on the resistor 15a and a resistor 15b, thus allowing the negative feed-back amplifier to be adjusted independently. Output impedance is so set as to prevent occurrence of reflection of an output signal "OUT" with considerations given to matching with characteristic impedance or load impedance of a transmission line connected to an output side of the negative feed-back circuit 15A.

As described above, according to the negative feed-back amplifier of the second embodiment, since the output signal V14a is input to an emitter follower of the transistor 15d, load is taken off the transistor 14a, thus distortion of the output signal V14a can be reduced. This is an advantage added to those in the first embodiment. Moreover, since the negative feed-back circuit 15A is mounted independently of an output circuit 14, even if the feedback ratio increases, a voltage of a collector of the transistor 14e does not drop and therefore the transistor 14e is not easily saturated, thus increasing load driving capacity and making calibration of output impedance easier.

Third Embodiment

Figure 6:
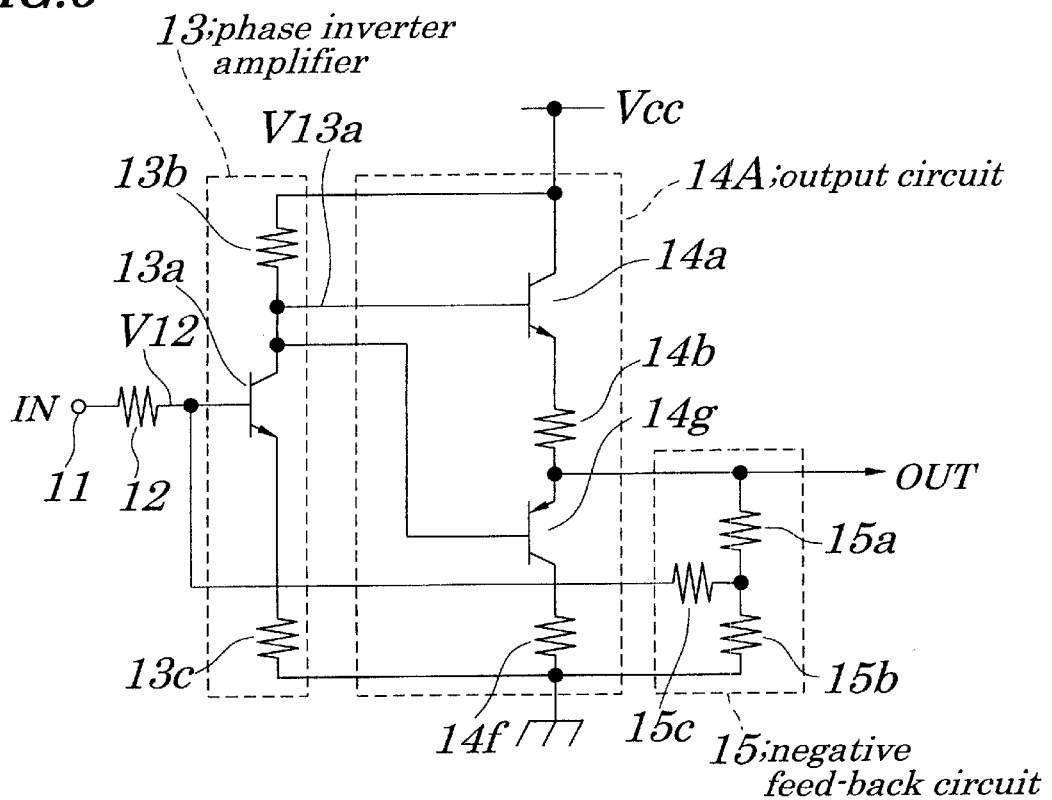
FIG. 6 is a schematic circuit diagram showing electric configurations of a negative feed-back amplifier according to a third embodiment of the present invention.

FIG. 6 is a schematic circuit diagram showing electric configurations of a negative feed-back amplifier according to a third embodiment of the prevent invention. In FIG. 6, the same reference numbers as those in the first embodiment are assigned to components having the same functions as in FIG. 1. In the negative feed-back amplifier of the third embodiment shown in FIG. 6, an output circuit 14A is mounted which has a configuration being different from an output circuit 14 in FIG. 1. In the output circuit 14A, a pnp-type transistor 14g, instead of an npn-type transistor 14e in FIG. 1, is mounted so as to make up a complementary emitter follower. Moreover, a collector of a transistor 13a is connected to a base of the pnp-type transistor 14g and a condenser 14c and bias circuit 14d shown in FIG. 1 are omitted. Other configurations in FIG. 6 are the same as those shown in FIG. 1.

In the negative feed-back amplifier of the embodiment, a reversed signal V13a is output from a collector of the transistor 13a and output reversed signal V13a is input to a base of the transistor 14a at high input impedance and, then, the reversed signal V13a is input to a base of the pnp-type transistor 14g at high input impedance. Operations thereafter are the same as in the case of the first embodiment.

Thus, since the condenser 14c shown in FIG. 1 is omitted in the negative feed-back amplifier of the third embodiment, circuit configurations are made simpler compared with those in a case of the first embodiment. Moreover, since an output signal "OUT" is attenuated by resistors 15a and 15b and is fed back to a base of the transistor 13a, the same effect as obtained in the first embodiment can be achieved.

Fourth Embodiment

Figure 7:
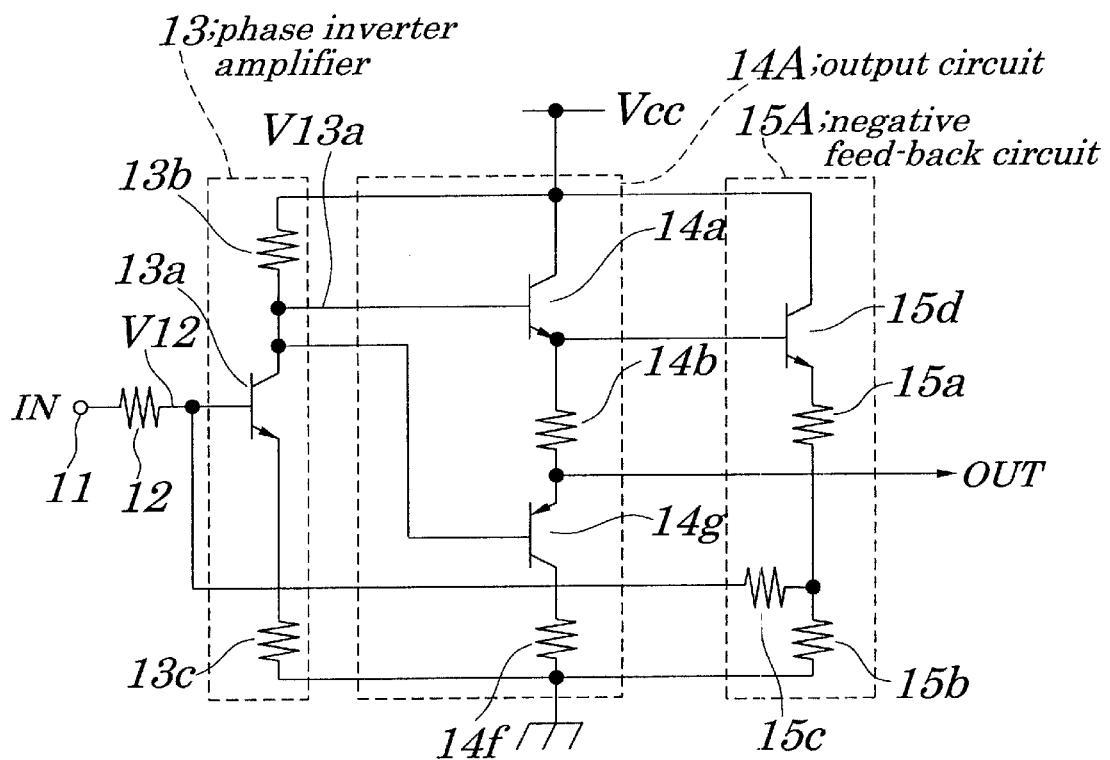
FIG. 7 is a schematic circuit diagram showing electric configurations of a negative feed-back amplifier according to a fourth embodiment of the present invention.
Figure 8:
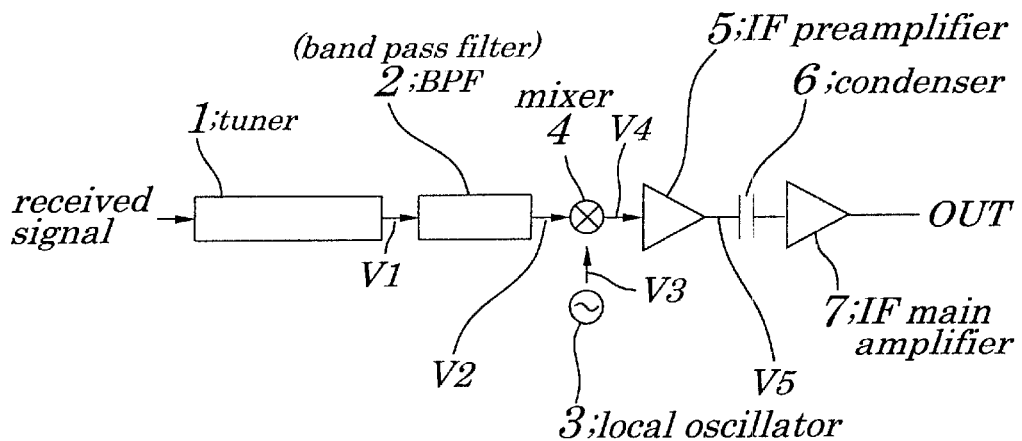
FIG. 8 is a schematic block diagram showing prior art picture signal related circuits of a television.
Figure 9:
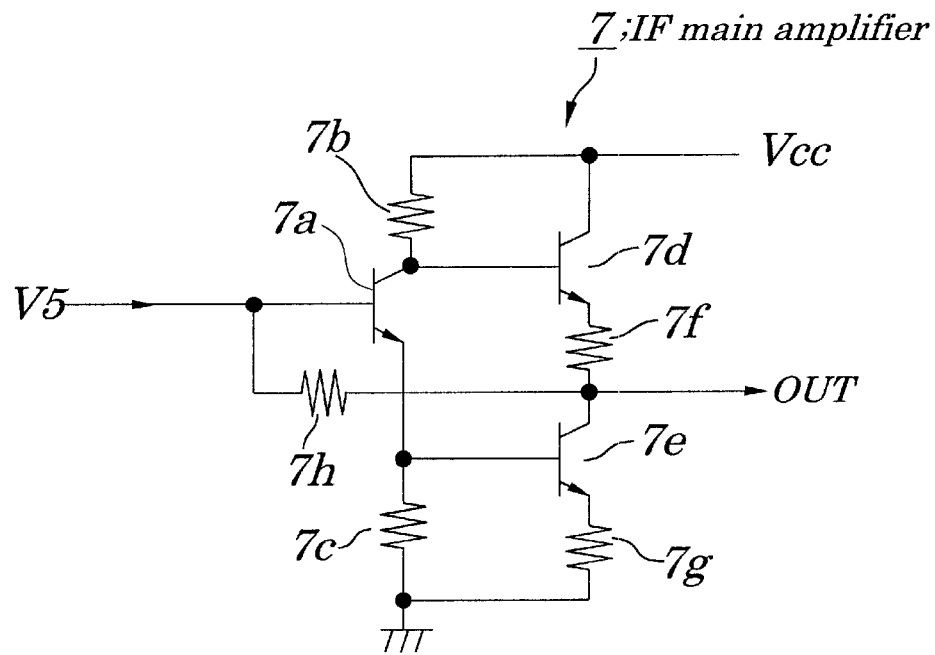
FIG. 9 is a circuit diagram showing electrical configurations of a prior art IF main amplifier shown in FIG. 8.

FIG. 7 is a schematic circuit diagram showing electric configurations of a negative feed-back amplifier according to a fourth embodiment of the present invention. In FIG. 7, the same reference numbers are assigned to components having the same functions in the second and third embodiments shown in FIG. 4 and in FIG. 6 respectively. In the negative feed-back amplifier of the fourth embodiment shown in FIG. 7, an output circuit 14A is provided which has a configuration being the same as the output circuit 14 in FIG. 6, instead of the output circuit 14 in FIG. 4. Other configurations are the same as those in FIG. 4.

In the negative feed-back amplifier of the fourth embodiment, a reversed signal V13a is output from a collector of a transistor 13a. The output reversed signal V13a is input to a base of a transistor 14a at high input impedance. Then, the reversed signal V13a is input to a base of a transistor 14g at high input impedance. Operations thereafter are the same as in a case of the second embodiment.

Thus, since a condenser 14c shown in FIG. 1 is omitted in the fourth embodiment as in a case of the third embodiment, circuit configurations are made simpler as compared with those in a case of the second embodiment. Moreover, as in the case of the second embodiment, since an output signal V14a is input from the transistor 14a to an emitter follower of a transistor 15d, a load is taken off the transistor 14a, thus distortion of the output signal V14a can be reduced. Moreover, even if feedback ratio increases, a voltage of a collector of a transistor 14e does not drop and therefore the transistor 14e is not easily saturated, thus increasing load driving capacity. Since a negative feed-back circuit 15A is mounted independently of the output circuit 14, output impedance can be easily calibrated.

It is apparent that the present invention is not limited to the above embodiments but may be changed and modified without departing from the scope and spirit of the invention. For example, in the second and fourth embodiments though an impedance converter is made up of an emitter follower of a transistor 15d, it may be made up of a source follower of an FET (Field Effect Transistor). Moreover, collectors of the transistor 15d shown in FIG. 4 and FIG. 7 may be connected to a terminal of an other supply power having a same ground as a supply power VCC.

What is claimed is:

1. A negative feed-back amplifier comprising:

a phase inverter amplifier for amplifying an input signal, said input signal being provided through an input terminal, and for producing a reversed signal of a phase opposite to said input signal and for producing a non-reversed signal in phase with said input signal;

a push-pull output circuit comprising at least two transistors having emitters, said push-pull output circuit for producing an output signal of a phase opposite to said input signal by inputting both said reversed signal and said non-reversed signal;

a negative feed-back circuit for producing a negative feed-back signal by inputting said output signal, said negative feedback circuit being connected to said input terminal and to both said emitters;

wherein said negative feed-back circuit is provided with a feedback ratio setting circuit for attenuating said output signal at a predetermined feedback ratio and for producing said negative feed-back signal.

2. The negative feed-back amplifier according to claim 1, wherein said feed-back ratio setting circuit comprises a plurality of resistors.

3. The negative feed-back amplifier according to claim 1, wherein said negative feed-back signal is added to said input signal through a resistor.

4. The negative feed-back amplifier according to claim 1, wherein said phase inverter amplifier comprises a bipolar transistor.

5. A negative feed-back amplifier comprising:

a phase inverter amplifier for amplifying an input signal, said input signal being provided through an input terminal, and for producing a reversed signal of a phase opposite to said input signal and for producing a non-reversed signal in phase with said input signal;

a push-pull output circuit comprising at least two transistors having emitters, said push-pull output circuit for producing an output signal of a phase opposite to said input signal by inputting both said reversed signal and said non-reversed signal;

a negative feed-back circuit for producing a negative feed-back signal by inputting said output signal, said negative feedback circuit being connected to said input terminal and to both said emitters;

wherein said negative feed-back circuit is provided with a feedback ratio setting circuit for attenuating said output signal at a predetermined feedback ratio and for producing said negative feed-back signal.

6. The negative feed-back amplifier according to claim 4, wherein said input signal and said negative feed-back signal are input to a base of said bipolar transistor, hereby a base bias voltage in said bipolar transistor is set properly.

7. The negative feed-back amplifier according to claim 5, wherein said feed-back ratio setting circuit comprises a plurality of resistors.

8. The negative feed-back amplifier according to claim 5, wherein said negative feed-back signal is added to said input signal through a resistor.

9. The negative feed-back amplifier according to claim 5, wherein said phase inverter amplifier comprises a bipolar transistor.

10. The negative feed-back amplifier according to claim 9, wherein said input signal and said negative feed-back signal are input to a base of said bipolar transistor, hereby a base bias voltage in said bipolar transistor is set properly.

* * * * *